US012733305B2

(12) United States Patent
Yang et al.

(10) Patent No.: US 12,733,305 B2
(45) Date of Patent: Sep. 8, 2026

(54) PACKAGING STRUCTURE AND ELECTRONIC DEVICE

(71) Applicant: VIVO MOBILE COMMUNICATION CO., LTD., Guangdong (CN)

(72) Inventors: Wanglai Yang, Guangdong (CN); Caihong Yang, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 577 days.

(21) Appl. No.: 18/309,485

(22) Filed: Apr. 28, 2023

(65) Prior Publication Data

US 2023/0261150 A1 Aug. 17, 2023

Related U.S. Application Data

(63) Continuation of application No. PCT/CN2021/126317, filed on Oct. 26, 2021.

(30) Foreign Application Priority Data

Oct. 30, 2020 (CN) ......................... 202011192715.3

(51) Int. Cl.
*H10H 20/85* (2025.01)
*G01D 5/26* (2006.01)
(Continued)

(52) U.S. Cl.
CPC ...... *H10H 20/8506* (2025.01); *H10H 20/856* (2025.01); *H10H 20/857* (2025.01); *H10W 90/00* (2026.01); *H10H 20/0362* (2025.01)

(58) Field of Classification Search
CPC ........ H10F 55/18; G01S 17/04; G01S 7/4812; G01S 7/4813; G01D 5/26; G01D 5/35367;
(Continued)

(56) References Cited

U.S. PATENT DOCUMENTS

2003/0111588 A1 6/2003 Chen
2009/0095881 A1 4/2009 Funakubo et al.
(Continued)

FOREIGN PATENT DOCUMENTS

CN 101158464 A 4/2008
CN 106453725 A 2/2017
(Continued)

OTHER PUBLICATIONS

Extended European Search Report for Application No. 21885128.5, dated Apr. 2, 2024. 8 Pages.
(Continued)

*Primary Examiner* — Antonio B Crite
(74) *Attorney, Agent, or Firm* — BROOKS KUSHMAN P.C.

(57) ABSTRACT

A packaging structure and an electronic device, and belongs to the technical field of packaging. The packaging structure includes a substrate, and a light emitting element, a photosensitive element, a light-transmitting package body, and a reflector that are disposed on a same side of the substrate, where the light-transmitting package body encloses the light emitting element, the photosensitive element, and the reflector; and the light emitting element is located between the reflector and the photosensitive element, a side of the light emitting element away from the photosensitive element has a light emitting surface, the reflector has a reflective surface facing the light emitting element, light emitted by the light emitting element is reflected to the outside of the packaging structure through the reflective surface, and the photosensitive element receives the light reflected back from the outside of the packaging structure.

16 Claims, 1 Drawing Sheet

(51) Int. Cl.

| | |
|---|---|
| ***H10F 55/00*** | (2025.01) |
| ***H10F 55/255*** | (2025.01) |
| ***H10F 77/40*** | (2025.01) |
| ***H10H 20/01*** | (2025.01) |
| ***H10H 20/856*** | (2025.01) |
| ***H10H 20/857*** | (2025.01) |
| ***H10W 90/00*** | (2026.01) |

(58) Field of Classification Search

CPC ....... G01D 5/32; G06F 1/1626; G06F 1/1637; H04N 23/54

See application file for complete search history.

(56) References Cited

U.S. PATENT DOCUMENTS

| | | | | |
|---|---|---|---|---|
| 2014/0252213 | A1 | 9/2014 | Ruh | |
| 2016/0141440 | A1 | 5/2016 | Chun et al. | |
| 2016/0187483 | A1 | 6/2016 | Luan et al. | |
| 2018/0031728 | A1 | 2/2018 | Han et al. | |
| 2018/0188105 | A1* | 7/2018 | Huang | G01J 1/08 |
| 2018/0292776 | A1 | 10/2018 | Ino et al. | |
| 2019/0029521 | A1 | 1/2019 | Kim et al. | |
| 2019/0346305 | A1 | 11/2019 | Ho et al. | |
| 2019/0361095 | A1 | 11/2019 | Lin | |
| 2019/0363216 | A1 | 11/2019 | Lin | |
| 2022/0140172 | A1* | 5/2022 | Tsou | H10F 55/20 257/82 |

FOREIGN PATENT DOCUMENTS

| | | | | | |
|---|---|---|---|---|---|
| CN | 107968884 | A | * | 4/2018 | H04M 1/72454 |
| CN | 108493185 | A | | 9/2018 | |
| CN | 108711566 | A | | 10/2018 | |
| CN | 112310062 | A | | 2/2021 | |
| EP | 3214462 | A1 | | 9/2017 | |
| JP | 2001156325 | A | | 6/2001 | |
| JP | 2008233202 | A | | 10/2008 | |
| JP | 2009038098 | A | | 2/2009 | |
| JP | 2009088433 | A | | 4/2009 | |
| JP | 2011096724 | A | * | 5/2011 | |

OTHER PUBLICATIONS

First Office Action for Japanese Application No. 2023-526448, dated Jan. 10, 2024, 6 Pages.

First Office Action for Chinese Application No. 202011192715.3, dated Feb. 21, 2022, 7 Pages.

International Search Report and Written Opinion for Application No. PCT/CN2021/126317, dated Jan. 26, 2022, 8 Pages.

* cited by examiner

PACKAGING STRUCTURE AND ELECTRONIC DEVICE

CROSS-REFERENCE TO RELATED APPLICATIONS

This application is a continuation of PCT International Application No. PCT/CN2021/126317 filed on Oct. 26, 2021, which claims priority to Chinese Patent Application No. 202011192715.3, filed on Oct. 30, 2020, which are incorporated herein by reference in their entireties.

TECHNICAL FIELD

The present application belongs to the technical field of packaging, and specifically, relates to a packaging structure and an electronic device.

BACKGROUND

With the advancement of technologies, electronic devices have become more intelligent, and more and more packaging structures have been applied to electronic devices. Optical sensors are used as an example, and their application in electronic devices can perform many functions such as automatic adjustment of screen brightness and automatic screen-off.

In order to improve the optical effect in a current packaging structure, a light blocking wall and a light shield are used in a packaging process to prevent optical crosstalk. However, the light blocking wall and the light shield occupy a relatively large space, resulting in a large size of the packaging structure.

SUMMARY

In a first aspect, the embodiments of the present application provide a packaging structure, where the packaging structure includes a substrate, and a light emitting element, a photosensitive element, a light-transmitting package body, and a reflector that are disposed on a same side of the substrate, and the light-transmitting package body encloses the light emitting element, the photosensitive element, and the reflector; and the light emitting element is located between the reflector and the photosensitive element, a side of the light emitting element away from the photosensitive element has a light emitting surface, the reflector has a reflective surface facing the light emitting element, light emitted by the light emitting element is reflected to the outside of the packaging structure through the reflective surface, and the photosensitive element receives the light reflected back from the outside of the packaging structure.

In a second aspect, the embodiments of the present application provide an electronic device, including a circuit board and a packaging structure disposed on the circuit board, where the packaging structure is the above-mentioned packaging structure.

Figure 1:
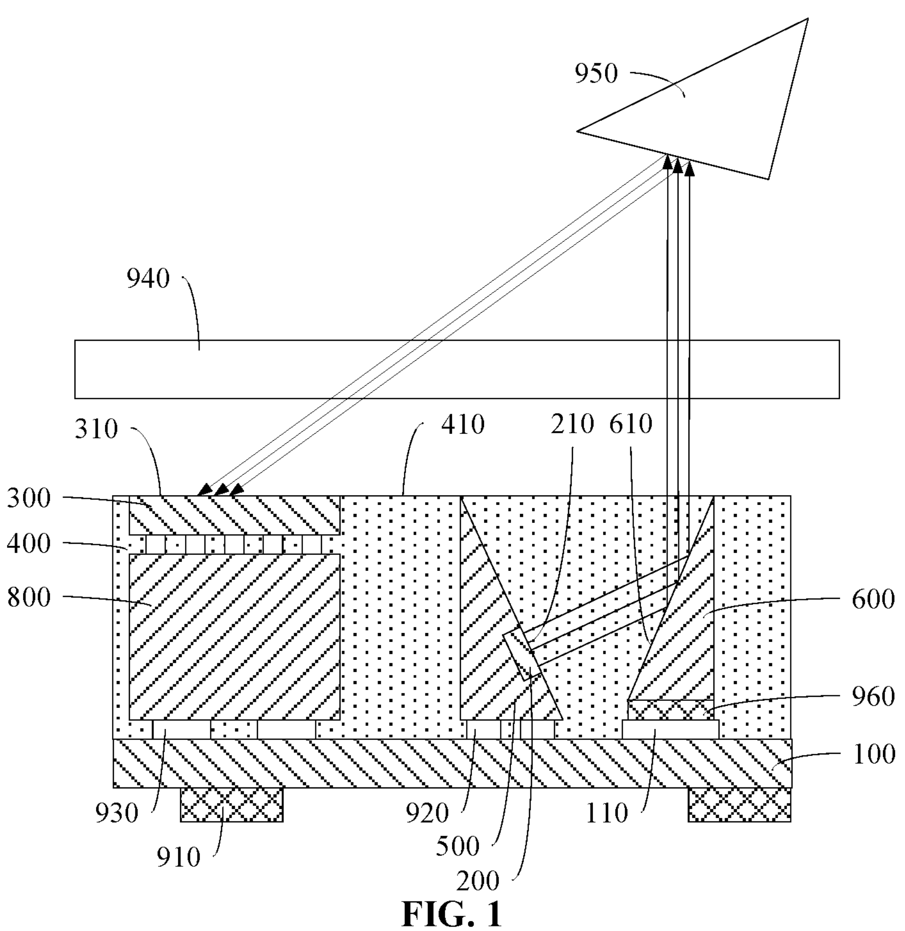
FIG. 1 is a schematic structural diagram of a packaging structure according to an embodiment of the present application.

The arrow line in FIG. 1 indicates a direction of a light path.

Reference numerals in the accompanying drawings are as follows:

100—substrate, 110—first positioning part, 120—second positioning part, 130—third positioning part, 200—light emitting element, 210—light emitting surface, 300—photosensitive element, 310—first top surface, 400—light-transmitting package body, 410—second top surface, 500—first carrier, 600—reflector, 610—reflective surface, 700—first conductor, 800—second carrier, 910—first pad, 920—second pad, 930—third pad, 940—cover plate, 950—object, 960—first bonding part, 970—second bonding part, and 980—third bonding part.

DETAILED DESCRIPTION

The following clearly describes the technical solutions in the embodiments of this application with reference to the accompanying drawings in the embodiments of this application. Apparently, the described embodiments are some but not all of the embodiments of this application. Based on the embodiments of this application, all other embodiments obtained by a person of ordinary skill in the art without creative efforts fall within the protection scope of this application.

Terms "first" and "second" in the specification and claims of this application are used to distinguish between similar objects, and do not need to be used to describe a specific order or sequence. It should be understood that, term used in such a way are interchangeable in proper circumstances, so that the embodiments of this application can be implemented in an order other than the order illustrated or described herein. Objects classified by "first", "second", and the like are usually of a same type, and the number of objects is not limited. For example, there may be one or more first objects. In addition, in the specification and the claims, "and/or" represents at least one of connected objects, and a character "/" generally represents an "or" relationship between associated objects.

With reference to the accompanying drawings, the following describes in detail the packaging structure and the electronic device in the embodiments of this application based on specific embodiments and application scenarios.

As shown in FIG. 1, the embodiments of the present application disclose a packaging structure, which includes a substrate 100, and a light emitting element 200, a photosensitive element 300, a light-transmitting package body 400, and a reflector 600 that are disposed on a same side of the substrate 100.

The substrate 100 provides an mounting basis for the light emitting element 200, the photosensitive element 300, the light-transmitting package body 400, and the reflector 600. The light emitting element 200, the photosensitive element 300, the light-transmitting package body 400, and the reflector 600 are all disposed on the same side of the substrate 100, and the light-transmitting package body 400 encloses the light emitting element 200, the light-sensitive element 300, and the reflector 600. The light-transmitting package body 400 can be a solid substance solidified from a liquid substance during packaging, or can be a solid-liquid mixture or other forms of substances. Compared with other forms of substances, solid substances basically have no fluidity, which can make the position of each device relatively fixed and improves the reliability of the packaging structure. Optionally, the light-transmitting package body 400 may be epoxy resin glue, which has strong light transmittance, can reduce the loss when light passes through the light-transmitting package body 400, and has a better packaging effect.

The light emitting element 200 can emit light, and the light can be emitted through the light-transmitting package body 400. When the emitted light passes through the cover plate 940 and reaches the surface of the object 950, the emitted light is reflected by the object 950, and the reflected light can pass through the cover plate 940 and enter the light-transmitting package body 400 and reach the photosensitive element 300. The photosensitive element 300 can receive this part of light and perform corresponding processing (such as photoelectric conversion) to obtain required information.

The light emitting element 200 is located between the reflector 600 and the photosensitive element 300. The side of the light emitting element 200 away from the photosensitive element 300 has a light emitting surface 210. The reflector 600 has a reflective surface 610 facing the light emitting element 200. The light emitted by the light emitting element 200 is reflected by the reflective surface 610 to the outside of the packaging structure, and the photosensitive element 300 receives the light reflected back from the outside of the packaging structure. The light emitted by the light emitting element 200 through the light emitting surface 210 needs to pass through the cover plate 940 to irradiate the object 950. The object 950 is located outside the packaging structure. The reflective surface 610 of the reflector 600 can change the path of the light emitted by the light emitting element 200, so that the light better satisfies the requirement on the light emitting direction, and more accurately illuminates the object 950.

In the embodiments of the present application, the light emitted by the light emitting element 200 passes through the light emitting surface 210 on the side away from the photosensitive element 300 to reach the reflective surface 610 on the side of the reflector 600 facing the light emitting element 200, the reflective surface 610 then reflects the light to the outside of the packaging structure, and after the light is reflected by an external object, the photosensitive element 300 receives the light reflected from the outside of the packaging structure, so as to complete corresponding processing. Compared with the packaging structure in the related art that uses a light blocking wall and a light shield to prevent light crosstalk, this method can change the direction of light emission, so that the light emitted by the light emitting element 200 is far away from the photosensitive element 300, thereby preventing light crosstalk. Therefore, there is no need to dispose a complex light blocking structure with a large space and the packaging structure has a smaller size.

Optionally, a side of the substrate 100 away from the light emitting element 200 is provided with a first pad 910, and the packaging structure can be mounted through the first pad 910, for example, the packaging structure can be mounted on a circuit board of an electronic device through the first pad 910.

In an optional embodiment, the light emitting surface 210 forms a non-zero angle with the substrate 100. That is, the light emitting surface 210 can be inclined relative to the substrate 100, so as to properly increase the distance between the light emitted by the light emitting element 200 and the photosensitive element 300, so as to better prevent light crosstalk. Optionally, the angle at which the light emitting surface is inclined relative to the substrate 100 may be 45° to 60°. On the one hand, this angle range can make the light emitted by the light emitting element 200 farther away from the photosensitive element 300. On the other hand, this ensures that the propagation path of the light emitted by the light emitting element 200 is not excessively long, thereby reducing light loss and improving the optical performance of the packaging structure.

In another optional embodiment, the packaging structure further includes a first carrier 500, and the light emitting element 200 is disposed on a side of the first carrier 500 away from the photosensitive element 300. Compared with the solution in which the light emitting element 200 is directly mounted on the substrate 100, the first carrier 500 can appropriately raise the light emitting element 200, so that the light emitted by the light emitting element 200 is emitted through a shorter path, thereby reducing light loss, improving optical performance of the packaging structure, and further preventing the optical crosstalk in the packaging structure.

Further, the first carrier 500 may be a light shielding structure. The first carrier 500 may be a component made of opaque material, which can prevent light from penetrating. The first carrier 500 is disposed between the light emitting element 200 and the photosensitive element 300, and can prevent the light emitted by the light emitting element 200 from directly irradiating the photosensitive element 300, or intersecting with the light received by the photosensitive element 300 to avoid light crosstalk. At the same time, higher light shielding requirements can be met only by using the first carrier 500, and the space occupied by the first carrier 500 is smaller. Therefore, the size of the entire packaging structure is smaller.

Further, the first carrier 500 is provided with a groove, and the light emitting element 200 is at least partially located in the groove. After adopting this structure, the light emitting element 200 is at least partially located in the groove, which can reduce the extra space occupied by the light emitting element 200 and facilitate the packaging of the light-transmitting package body 400. In addition, the groove can also assist in restricting the position of the light emitting element 200, so that the light emitting element 200 is not easy to be displaced relative to the first carrier 500, so that its position accuracy is higher. When the first carrier 500 is a light shielding structure, the light emitting element 200 is at least partially recessed relative to the first carrier 500, so that the distance between the light emitting surface 210 of the light emitting element 200 and the first carrier 500 is closer, and more light emitted by the light emitting element 200 can be blocked by the first carrier 500, thereby improving the light blocking effect of the first carrier 500.

Figure 2:
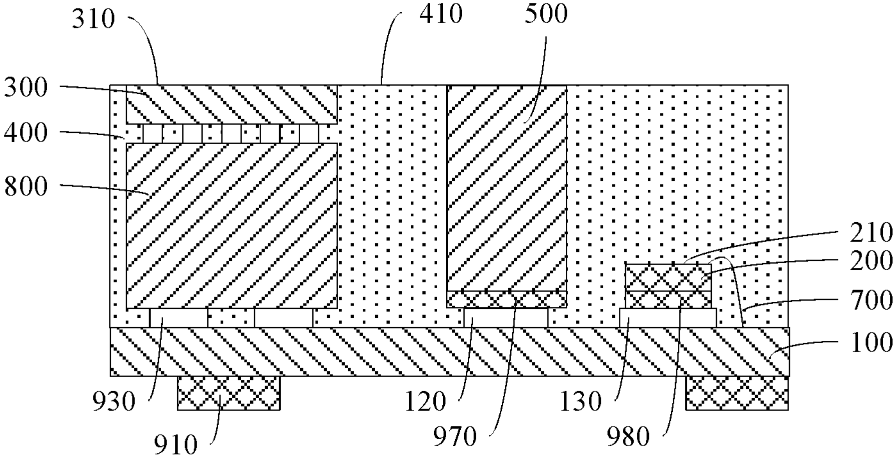
FIG. 2 is a schematic structural diagram of a packaging structure according to another embodiment of the present application.

In an embodiment, the light emitting element 200 is electrically connected to the substrate 100 through the first carrier 500, that is, an electrical connection structure may be provided in the first carrier 500, so that the light emitting element 200 is electrically connected to the substrate 100 through the electrical connection structure. Alternatively, as shown in FIG. 2, the light emitting element 200 is electrically connected to the substrate 100 through a first conductor 700, where the first conductor 700 is located outside the first carrier 500. The electrical connection of the light emitting element 200 to the substrate 100 through the first carrier 500 can reduce the number of components in the packaging structure and make the structure of the packaging structure simpler. The light emitting element 200 is electrically connected to the substrate 100 through the first conductor 700, which can simplify the manner of electrical conduction between the light emitting element 200 and the substrate 100.

Optionally, when the light emitting element 200 adopts the above-mentioned first electrical conduction method, the first carrier 500 can be connected to the substrate 100 through the second pad 920, and the second pad 920 can realize the mechanical connection between the first carrier 500 and the substrate 100, and can also realize the electrical connection between the first carrier 500 and the substrate 100.

The photosensitive element 300 has a first top surface 310, the first top surface 310 is a surface of the photosensitive element 300 away from the substrate 100, the light-transmitting package body 400 has a second top surface 410, and the second top surface 410 is a surface of the light-transmitting package body 400 away from the substrate 100. The first top surface 310 may be lower than the second top surface 410, higher than the second top surface 410, or be flush with the second top surface 410. When the first top surface 310 is lower than the second top surface 410, the position of the photosensitive element 300 is lower, and its ability to receive light is poorer. When the first top surface 310 is higher than the second top surface 410, the photosensitive element 300 is at least partially located outside the light-transmitting package body 400, and the packaging effect is poorer. When the first top surface 310 is flush with the second top surface 410, this can increase the amount of light that the photosensitive element 300 can receive, thereby improving the light receiving efficiency of the photosensitive element 300, the packaging effect can be improved, and the size of the package structure can be minimized.

In an optional embodiment, the packaging structure further includes a second carrier 800, the second carrier 800 is disposed on the substrate 100, and the photosensitive element 300 is disposed on a side of the second carrier 800 away from the substrate 100. The position of the photosensitive element 300 has a crucial influence on its light receiving efficiency. After the second carrier 800 is added, the height of the photosensitive element 300 relative to the substrate 100 can be appropriately increased, so that the distance between the photosensitive element 300 and the light can be closer to receive more light. At the same time, after the photosensitive element 300 is raised by the second carrier 800, other parts of the packaging structure of the packaging device are less likely to prevent the light from irradiating the photosensitive element 300. Therefore, this embodiment can further improve the light receiving efficiency of the photosensitive element 300.

In an embodiment, the photosensitive element 300 is electrically connected to the substrate 100 through the second carrier 800, that is, an electrical connection structure may be provided in the second carrier 800, so that the photosensitive element 300 is electrically connected to the substrate 100 through the electrical connection structure. Alternatively, the photosensitive element 300 is electrically connected to the substrate 100 through a second conductor, where the second conductor is located outside the first carrier 500. The electrical connection of the photosensitive element 300 to the substrate 100 through the second carrier 800 can reduce the number of components in the packaging structure and make the structure of the packaging structure simpler. The photosensitive element 300 is electrically connected to the substrate 100 through the second conductor, which can simplify the electrical conduction between the photosensitive element 300 and the substrate 100.

Optionally, when the photosensitive element 300 adopts the above-mentioned first electrical conduction method, the second carrier 800 can be connected to the substrate 100 through the third pad 930, and the third pad 930 can realize the mechanical connection between the second carrier 800 and the substrate 100, and can also realize the electrical connection between the second carrier and the substrate.

Optionally, the substrate 100 is provided with a first positioning part 110, and the reflector 600 is disposed on the first positioning part 110. Compared with the method in which the reflector 600 is directly mounted on the substrate 100, the first positioning part 110 herein has the function of pre-positioning. In mounting the reflector 600, the reflector 600 is directly fixed on the first positioning part 110. This arrangement not only facilitates the mounting of the reflector 600, improves the mounting efficiency of the reflector 600, and makes the position of the reflector 600 relative to the substrate 100 more accurate, improving the quality of the packaging device.

Further optionally, the reflector 600 can be fixed on the first positioning part 110 through a first bonding part 960. This connection method can simplify the mounting operation of the reflector 600 and the first positioning part 110, and can also improve the mounting reliability of the reflector and the first positioning part.

As shown in FIG. 2, in other embodiments, the first carrier 500 is located between the light emitting element 200 and the photosensitive element 300, and the light emitting element 200 has a light emitting surface 210 parallel to the substrate 100. In this embodiment, the first carrier 500, the light emitting element 200 and the photosensitive element 300 are relatively independent, and each of the three is connected to the substrate 100. The light emitting element 200 and the first carrier 500 may be in direct contact or have a gap. Light can be reliably shielded by the first carrier 500, and therefore the structure of the packaging structure in this solution is simpler.

When the first carrier 500 is located between the light emitting element 200 and the photosensitive element 300, the light emitting element 200 can be electrically connected to the substrate 100 through the pad, or can be electrically connected to the substrate 100 through the first conductor 700. The substrate 100 can be provided with a second positioning part 120, and the first carrier 500 can be fixed on the second positioning part 120 through the second bonding part 970, so as to connect the first carrier 500 and the substrate 100. When the light emitting element 200 is electrically connected to the substrate 100 through the first conductor 700, the substrate 100 can be provided with a third positioning part 130, and the light emitting element 200 is fixed on the third positioning part 130 through the third bonding part 980, so as to connect the light emitting element 200 and the substrate 100.

Based on the packaging structure described in the above-mentioned embodiments, the embodiment of the present application also discloses an electronic device, which includes a circuit board and a packaging structure disposed on the circuit board, and the packaging structure is the packaging structure in any one of the above-mentioned embodiments. The electronic device in this embodiment of this application may be a device, such as a smart phone, a tablet computer, an e-book reader, a wearable device (for example, a smart watch), and a video game console. The embodiments of this application do not limit the specific type of the electronic device.

The embodiments of this application are described with reference to the accompanying drawings. However, this application is not limited to the foregoing specific implementations. The foregoing specific implementations are merely examples, but are not limiting. A person of ordinary skill in the art may make many forms without departing from the objective and the scope of the claims of this application, and these forms all fall within the protection scope of this application.

The invention claimed is:

1. A packaging structure, comprising a substrate, and a light emitting element, a photosensitive element, a light-transmitting package body, and a reflector that are disposed on a same side of the substrate, wherein the light-transmitting package body encloses the light emitting element, the photosensitive element, and the reflector; and the light emitting element is located between the reflector and the photosensitive element, a side of the light emitting element away from the photosensitive element has a light emitting surface, the reflector has a reflective surface facing the light emitting element, light emitted by the light emitting element is reflected to the outside of the packaging structure through the reflective surface, and the photosensitive element receives light reflected back from the outside of the packaging structure;

wherein the packaging structure further comprises a first carrier, and the light emitting element is disposed on a surface of the first carrier away from the photosensitive element;

wherein the first carrier is a light shielding structure.

2. The packaging structure according to claim 1, wherein the light emitting surface forms a non-zero angle with the substrate.

3. The packaging structure according to claim 1, wherein the first carrier is provided with a groove, and the light emitting element is at least partially located in the groove.

4. The packaging structure according to claim 1, wherein the light emitting element is electrically connected to the substrate through the first carrier.

5. The packaging structure according to claim 1, wherein the substrate is provided with a first positioning part, and the reflector is disposed on the first positioning part.

6. The packaging structure according to claim 1, wherein the packaging structure further comprises a second carrier, the second carrier is disposed on the substrate, and the photosensitive element is disposed on a side of the second carrier away from the substrate.

7. The packaging structure according to claim 6, wherein the photosensitive element is electrically connected to the substrate through the second carrier; or the photosensitive element is electrically connected to the substrate through a second conductor.

8. An electronic device, comprising a circuit board and a packaging structure disposed on the circuit board, wherein the packaging structure comprises a substrate, a light emitting element, a photosensitive element, a light-transmitting package body, and a reflector that are disposed on a same side of the substrate, wherein the light-transmitting package body encloses the light emitting element, the photosensitive element, and the reflector; and the light emitting element is located between the reflector and the photosensitive element, a side of the light emitting element away from the photosensitive element has a light emitting surface, the reflector has a reflective surface facing the light emitting element, light emitted by the light emitting element is reflected to the outside of the packaging structure through the reflective surface, and the photosensitive element receives light reflected back from the outside of the packaging structure;

wherein the packaging structure further comprises a first carrier, and the light emitting element is disposed on a surface of the first carrier away from the photosensitive element;

wherein the first carrier is a light shielding structure.

9. The electronic device according to claim 8, wherein the light emitting surface forms a non-zero angle with the substrate.

10. The electronic device according to claim 8, wherein the first carrier is provided with a groove, and the light emitting element is at least partially located in the groove.

11. The electronic device according to claim 8, wherein the light emitting element is electrically connected to the substrate through the first carrier.

12. The electronic device according to claim 8, wherein the photosensitive element has a first top surface, the light-transmitting package body has a second top surface, and the first top surface is flush with the second top surface.

13. The electronic device according to claim 8, wherein the substrate is provided with a first positioning part, and the reflector is disposed on the first positioning part.

14. The electronic device according to claim 8, wherein the packaging structure further comprises a second carrier, the second carrier is disposed on the substrate, and the photosensitive element is disposed on a side of the second carrier away from the substrate.

15. The electronic device according to claim 14, wherein the photosensitive element is electrically connected to the substrate through the second carrier; or the photosensitive element is electrically connected to the substrate through a second conductor.

16. A packaging structure, comprising a substrate, and a light emitting element, a photosensitive element, a light-transmitting package body, and a reflector that are disposed on a same side of the substrate, wherein the light-transmitting package body encloses the light emitting element, the photosensitive element, and the reflector; and the light emitting element is located between the reflector and the photosensitive element, a side of the light emitting element away from the photosensitive element has a light emitting surface, the reflector has a reflective surface facing the light emitting element, light emitted by the light emitting element is reflected to the outside of the packaging structure through the reflective surface, and the photosensitive element receives light reflected back from the outside of the packaging structure;

wherein the photosensitive element has a first top surface, the light-transmitting package body has a second top surface, and the first top surface is flush with the second top surface.

* * * * *